US007313451B2

(12) United States Patent
Takayama et al.

(10) Patent No.: US 7,313,451 B2
(45) Date of Patent: Dec. 25, 2007

(54) PLASMA PROCESSING METHOD, DETECTING METHOD OF COMPLETION OF SEASONING, PLASMA PROCESSING APPARATUS AND STORAGE MEDIUM

(75) Inventors: Naoki Takayama, Nirasaki (JP); Bin Wang, Nirasaki (JP); Satoshi Harada, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 409 days.

(21) Appl. No.: 10/937,905

(22) Filed: Sep. 10, 2004

(65) Prior Publication Data

US 2005/0126709 A1    Jun. 16, 2005

(51) Int. Cl.
*G06F 17/00* (2006.01)

(52) U.S. Cl. .................... 700/90; 315/111.21
(58) Field of Classification Search .................. 700/90; 315/111.01, 111.11, 111.21, 111.31, 111.41, 315/111.51, 111.61, 111.71, 111.81, 111.91
See application file for complete search history.

(56) References Cited

U.S. PATENT DOCUMENTS

| 6,214,162 B1 * | 4/2001 | Koshimizu | ............. | 156/345.28 |
| 2003/0052083 A1 * | 3/2003 | Kim et al. | .................... | 216/59 |

FOREIGN PATENT DOCUMENTS

| EP | 1 089 146 | | 4/2001 |
| JP | 11-31599 | | 2/1999 |
| JP | 2001-060585 | * | 7/1999 |
| JP | 2002-25981 | | 1/2002 |
| WO | WO 03/077303 | | 9/2003 |

OTHER PUBLICATIONS

Notification of Receipt of Record Copy (Form PCT/IB/301) issued in connection with PCT/JP03/02932.
Notification Concerning Submission or Transmittal of Priority Document (Form PCT/IB/304) issued in connection with PCT/JP03/02932.
Notification of Change of Name issued in connection with PCT/JP03/02932.
Notice Informing the Applicant of the Communication of the International Application to the Designated Offices issued in connection with PCT/JP03/02932.

* cited by examiner

*Primary Examiner*—Kidest Bahta
*Assistant Examiner*—Chad Rapp
(74) *Attorney, Agent, or Firm*—Smith, Gambrell & Russell, LLP

(57) ABSTRACT

With analysis data in the prior art, it is difficult to find out if a change regarded as a judgmental standard of the completion of seasoning has come from a change due to the seasoning, namely, change in condition of the interior of a processing container or come from another change based on a temperature change among respective dummy wafers and furthermore, it is difficult to judge whether the seasoning has been completed or not. Therefore, a plasma processing method of the present invention, which is a method for detecting the completion of seasoning in performing the seasoning by loading dummy wafers W into a processing container 2 of a plasma processing apparatus 1, includes a process of creating a predictive formula for predicting the completion of seasoning and another process of detecting the completion of seasoning in performing the seasoning, based on the predictive formula. The creation of the predictive formula is accomplished by performing a multivariate analysis against a plurality of measured data that can be obtained by first supplying dummy wafers W into the processing container 2, cooling down the interior of the processing container 2 and supplying a plurality of dummy wafers W into the processing container 2 again.

11 Claims, 10 Drawing Sheets

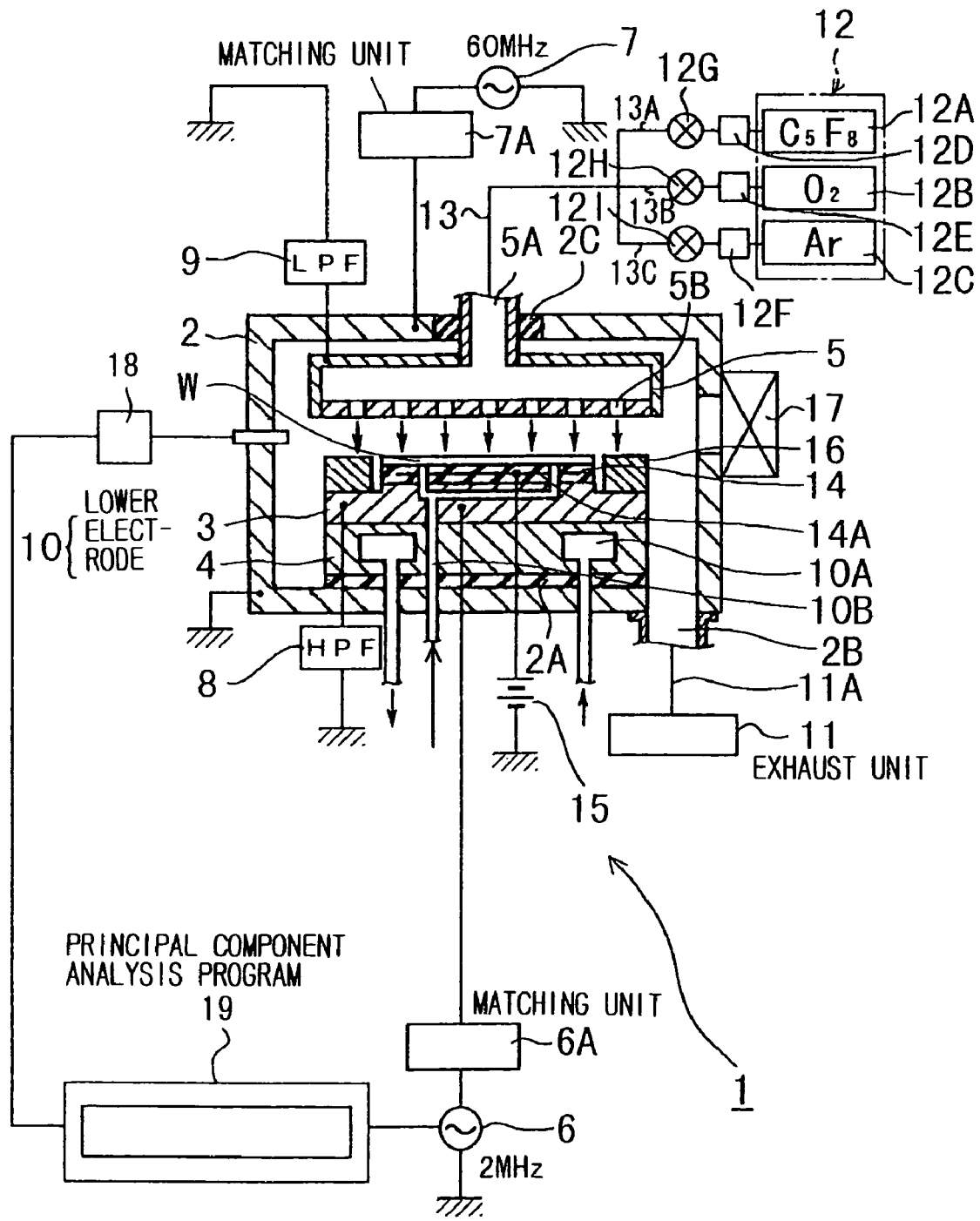
F I G. IA

Hotellings T2 SEA-F3E2.M11 (PC), W=135-154 K=297, Prediction set

SEA-F3E2.M11 (PC), W=135-154 K=297, PS-731-801
DModX(PS),N, Comp 7 (Cum)

Hotellings T2 SEA-AVE.M1 (PC), W=135-154 K=297, Prediction set
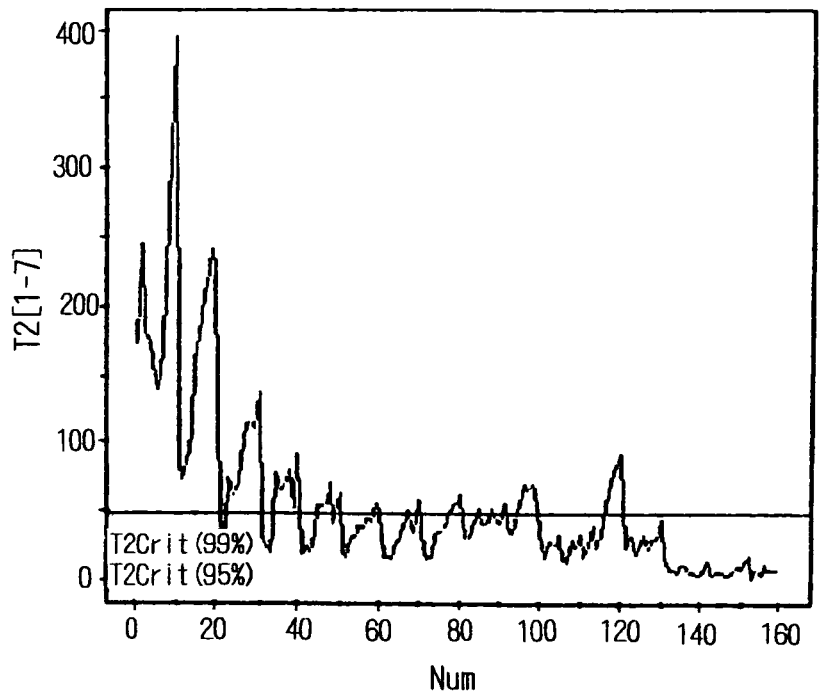
F I G. 3A
SEA-AVE.M1 (PC), W=135-154 K=297, PS-SEA-AVE2
DModX(PS),N, Comp 7 (Cum)
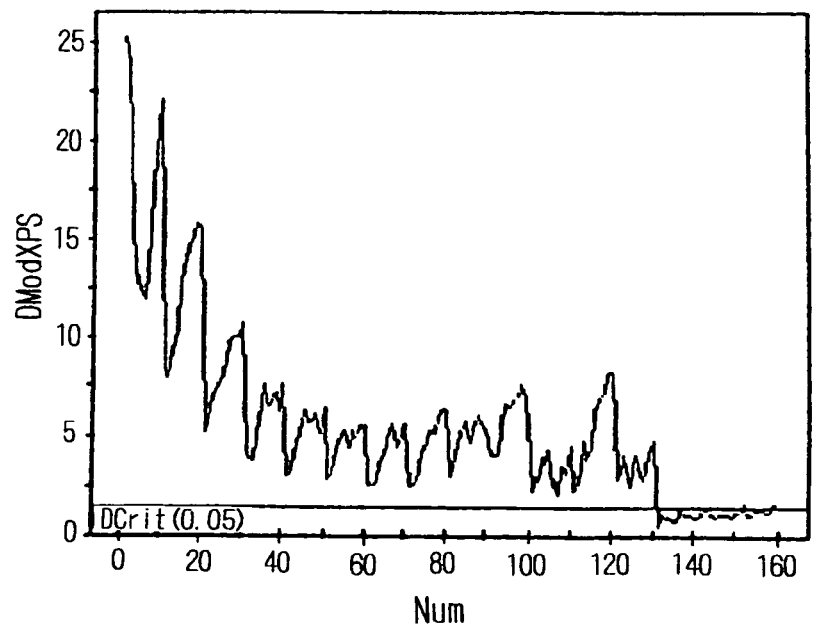
F I G. 3B Hotellings T2 SEA-AVE.M3 (PC), LDC M11 Obs1 K=10, Prediction set
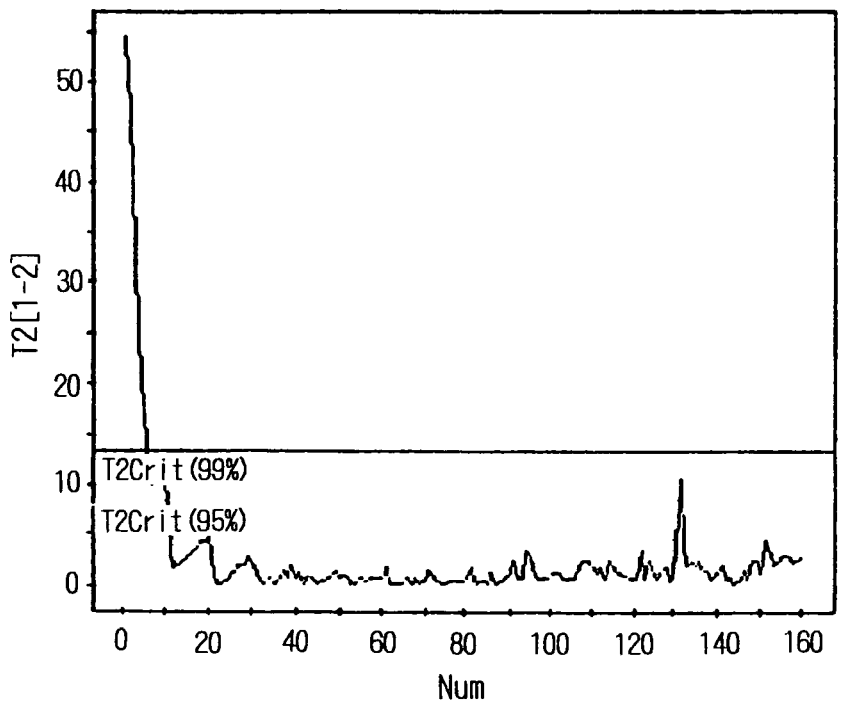
F I G. 5A
SEA-AVE.M3 (PC), LDC M11 Obs1 K=10, PS-SEA-AVE2
DModX(PS),N, Comp 2 (Cum)
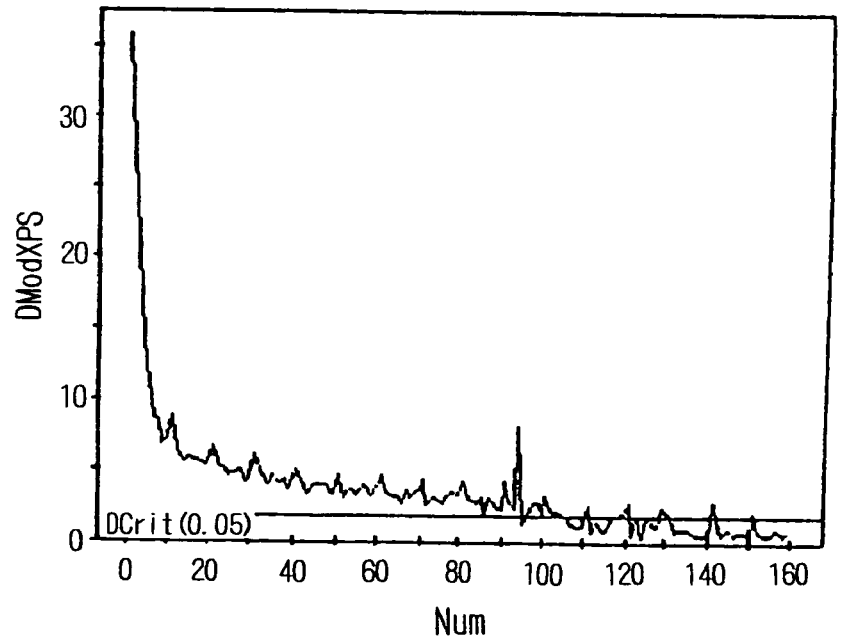
F I G. 5B Hotellings T2 M11-LDC.M1 (PC), W=135-154, Prediction set M11-LDC.M1 (PC), W=135-154, PS-130+30
DModX(PS),N, Comp 4 (Cum)

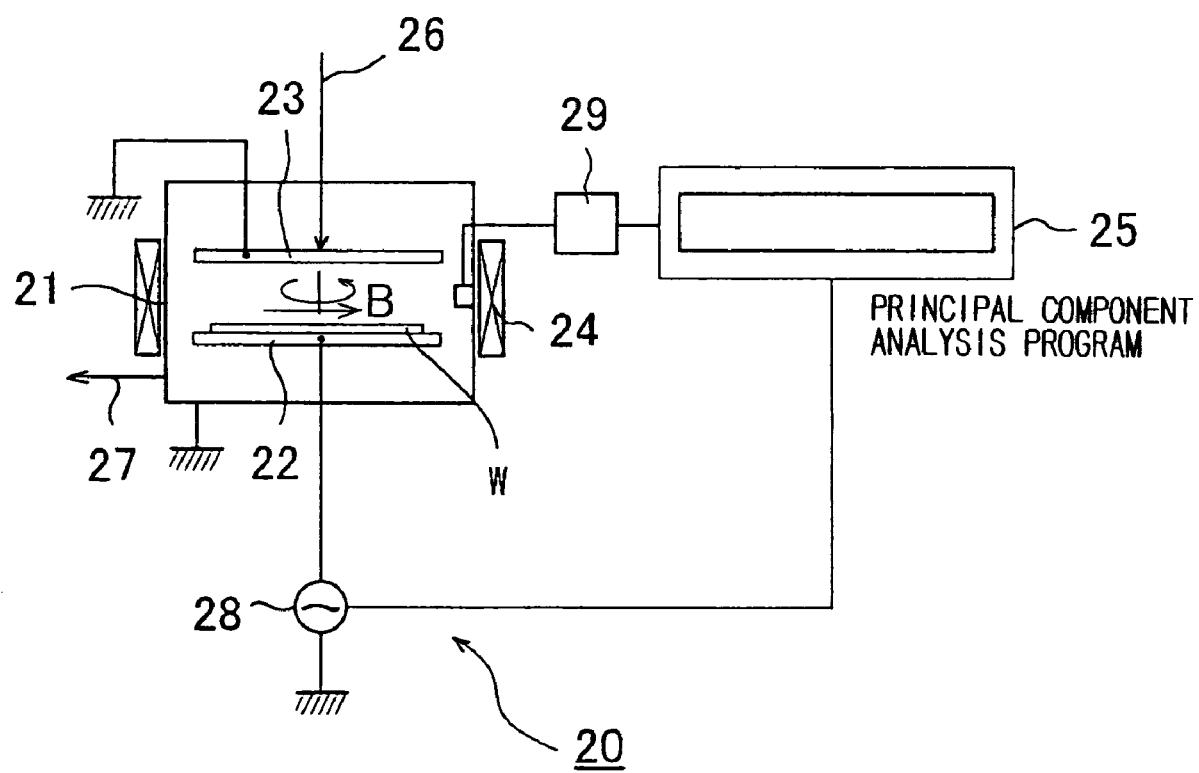
F I G. 7

Hotellings T2 SEA-F3E2.M3 (PC), W=121-130 K=297, Prediction set

SEA-F3E2.M3 (PC), W=121-130 K=297, PS-731-801
DModX(PS),N, Comp 10 (Cum)

PLASMA PROCESSING METHOD, DETECTING METHOD OF COMPLETION OF SEASONING, PLASMA PROCESSING APPARATUS AND STORAGE MEDIUM

TECHNICAL FIELD

This invention relates to a plasma processing method, a detecting method of a completion of seasoning, a plasma processing apparatus and a storage medium which may be used in an etching apparatus etc.

BACKGROUND OF ART

A processing apparatus, for example, an etching apparatus includes a processing container structured in an airtight manner and a holding body arranged in the processing container to hold a substrate to be processed and further produces a plasma to apply a designated processing on the substrate. When the processing on the substrate is continued, the interior of the processing container may be contaminated by by-products etc. or internal components may be wasted. Therefore, it is performed to stop the operation of the processing apparatus once and further carry out maintenance, such as cleaning of the interior of the processing apparatus and exchanging of consumable parts. After completion of the maintenance, the processing apparatus is restarted.

For example, in case of an etching apparatus, when restarting the operation, it is carried out to supply an interior of the apparatus with a designated number of dummy wafers and further repeat an etching cycle thereon, performing so-called "seasoning" in order to regularize an interior of the apparatus as required at the production. After completion of the seasoning, etching rate, in-plane uniformity of etching, etc. are examined. Here performed is a data analysis using a measured data obtained by the plural dummy wafers at seasoning, for example, data analysis using a measured data of emission spectrum obtained by an end-point detector. Then, a judgment whether the seasoning has been completed is accomplished by reviewing the change of such an analyzed date.

In the conventional analyzed data, however, it is remarkably difficult to find out whether a change providing a judgmental standard for completion of seasoning comes from a change due to the seasoning, in other words, the change based on a change of the state in the processing container or comes from another change based on a change in temperature among the respective dummy wafers.

That is, although the inventors have analyzed the measured data by use of a principal component analysis as being one multivariate analysis as described later, the analysis results in that there are recognized two great peaks each exhibiting changes, thereby making it difficult to judge whether the seasoning has been completed or not. Now, we describe this principal component analysis. In this case, the measured data has been picked as per usual. For instance, it was carried out on the first day to load one hundred and thirty (130) dummy wafers and subsequently carried out on the second day to load thirty (30) dummy wafers for etching under the flow of production. As a result of applying principal component analysis on the measured data of emission spectrum of the $51^{st}$. to $60^{th}$. dummy wafers and the $121^{st}$. to $130^{th}$. dummy wafers on the first day, we obtained analytic results as shown in FIGS. 8A, 8B and FIGS. 9A, 9B. In this principal component analysis, by use of 297 sorts of wavelengths in the short-wavelength range from 193 nm to 419 nm, it is carried out to measure the intensities of the respective wavelengths for eighteen (18) times every three seconds in one minute per one dummy wafer and furthermore, the principal component analysis is applied on the so-obtained measured data. Then, the scores of principal components and the residual errors at the respective measurements are calculated respectively. By plotting HOTELLINGS TSQUARE (square sums of the scores of the principal components), we obtained FIGS. 8A and 9A. Further, by plotting the square sums of the residual errors (residual scores), we obtained FIGS. 8B and 9B. As obvious from these analytic results, FIGS. 3A and 3B, these are recognized great peaks on the first day and also the second day in each graph thereby making it difficult to judge the completion of seasoning. It is noted that the horizontal axis of each graph denotes the number of measurements.

In order to solve the above problem, an object of the present invention is to provide a plasma processing method, a detecting method of the completion of seasoning, a plasma processing apparatus and a storage medium, all that make it possible to judge the completion of seasoning definitely.

As a result of the inventors' studying on the reason of two peaks recognized, it is found that such an appearance of two peaks is attributable to the picking method of measured data used for the data-analysis. Consequently, we obtain a knowledge that the application of a specified process on a processing container in picking data would allow a change due to the seasoning to be grasped certainly while eliminating an influence due to temperature change among the dummy wafers, whereby the completion of seasoning can be judged absolutely.

DISCLOSURE OF THE INVENTION

The present invention has been accomplished on the basis of the above knowledge. The invention relating to claim 1 is characterized by a plasma processing method for detecting a completion of seasoning in case of performing a seasoning by loading test objects to be processed into a processing container of a processing apparatus, the method comprising the steps of: creating a predictive formula for predicting the completion of seasoning, the predictive formula being created by applying a multivariate analysis on a plurality of measured data that can be obtained by loading the plural test objects into the processing container; and detecting the completion of seasoning in performing the seasoning, on a basis of the predictive formula.

The plasma processing method relating to Claim 2 is characterized in that in the invention of Claim 1, the multivariate analysis is carried out by employing a principal component analysis.

The plasma processing method relating to Claim 3 is characterized in that in the invention of Claim 1, the multivariate analysis is carried out by employing an emission spectrum of a plasma as the measured data.

The plasma processing method relating to Claim 4 is characterized in that in the invention of Claim 3, among wavelengths of the emission spectrum, a wavelength having a high contribution ratio to a residual error is employed.

The plasma processing method relating to Claim 5 is characterized in that in the invention of Claim 1, the multivariate analysis is carried out by employing a high-frequency voltage obtained by an electricity measuring unit, as the measured data.

The plasma processing method relating to Claim 6 is characterized in that in the invention of Claim 1, the multivariate analysis is carried out by employing a high-frequency current obtained by an electricity measuring unit, as the measured data.

The plasma processing method relating to Claim 7 is characterized in that in the invention of Claim 1, the multivariate analysis is carried out by employing a difference in phase between a high-frequency voltage and a high-frequency current both obtained by an electricity measuring unit, as the measured data.

The plasma processing method relating to Claim 8 is characterized in that in the invention of Claim 1 the step of creating a predictive formula is creating a predictive formula for predicting the completion of seasoning, the predictive formula being created by applying a multivariate analysis on a plurality of measured data that can be obtained by loading the test objects into the processing container, cooling an interior of the processing container and subsequently loading the plural test objects into the processing container.

A seasoning-completion detecting method relating to Claim 9 is characterized in that in the seasoning-completion detecting method for detecting a completion of seasoning in case of performing a seasoning by loading test objects to be processed into a processing container of a processing apparatus, the method comprises the steps of: creating a predictive formula for predicting the completion of seasoning, the predictive formula being created by applying a multivariate analysis on a plurality of measured data that can be obtained by loading the plural test objects into the processing container; and detecting the completion of seasoning in performing the seasoning, on a basis of the predictive formula.

The plasma processing method relating to Claim 10 is characterized in that in the invention of Claim 9 the step of creating a predictive formula is creating a predictive formula for predicting the completion of seasoning, the predictive formula being created by applying a multivariate analysis on a plurality of measured data that can be obtained by loading the test objects into the processing container, cooling an interior of the processing container and subsequently loading the plural test objects into the processing container.

A plasma processing apparatus relating to Claim 11 is characterized in that the plasma processing apparatus comprises: a processing container for accommodating an object to be processed; a detecting unit for measuring an emission spectrum of a plasma in the processing container; and a control unit which is connected to the detecting unit and constructed so as to input measured data from the detecting unit, the control unit being adapted so as to create a predictive formula for predicting a completion of seasoning and further detect the completion of seasoning in performing the seasoning on a basis of the predictive formula, wherein the predictive formula is created by applying a multivariate analysis using a multivariate analysis program on a plurality of measured data that can be measured by the detecting unit in the process of: loading plural test objects to be processed into the processing container.

A plasma processing apparatus relating to Claim 12 is characterized in that in the invention of Claim 11 the measured data are a plurality of measured data that can be obtained in the process of: loading test objects to be processed into the processing container; cooling an interior of the processing container; and subsequently loading the plural test objects into the processing container again.

A plasma processing apparatus relating to Claim 13 is characterized in that the plasma processing apparatus comprises: a processing container for accommodating an object to be processed; an electricity measuring unit arranged in the processing container; and a control unit which is connected to the electricity measuring unit and constructed so as to input measured data from the electricity measuring unit, the control unit being adapted so as to create a predictive formula for predicting a completion of seasoning and further detect the completion of seasoning in performing the seasoning on a basis of the predictive formula, wherein the predictive formula is created by applying a multivariate analysis using a multivariate analysis program on a plurality of measured data that can be measured by the electricity measuring unit in the process of: loading plural test objects into the processing container.

A plasma processing apparatus relating to Claim 14 is characterized in that in the invention of Claim 13 the measured data are a plurality of measured data that can be obtained in the process of: loading test objects to be processed into the processing container; cooling an interior of the processing container; and subsequently loading the plural test objects into the processing container again.

A storage medium relating to Claim 15 having a program for detecting a completion of seasoning in case of performing a seasoning by loading test objects to be processed into a processing container of a processing apparatus, the program comprising the steps of: creating a predictive formula for predicting the completion of seasoning, the predictive formula being created by applying a multivariate analysis on a plurality of measured data that can be obtained by loading the plural test objects into the processing container; and detecting the completion of seasoning on the basis of the predictive formula.

A storage medium relating to Claim 16 is characterized in that in the invention of Claim 15, the measured data are a plurality of measured data that can be obtained in the process of: loading test objects to be processed into the processing container; cooling an interior of the processing container; and subsequently loading the plural test objects into the processing container again.

BRIEF DESCRIPTION OF THE DRAWINGS

FIG. 1A is a structural view showing one example of a plasma processing apparatus to which an analytic method of seasoning data, a plasma processing method and a detecting method of completion of seasoning of the present invention are applied.

FIGS. 2A and 2B are diagrams showing analytic results of measured data related to the plasma processing apparatus shown in FIG. 1, obtained by one embodiment of the present invention, in which FIG. 2A is a graph showing a variation of the square sums of scores of principal components of the measured data, and FIG. 2B is a graph showing a variation of scores of residual errors of the measured data;

FIGS. 3A and 3B are diagrams showing the analytic results obtained by another embodiment of the present invention, corresponding to FIGS. 2A and 2B, respectively;

FIGS. 5A and 5B are diagrams showing the analytic result obtained by using a mean of wavelengths shown in FIG. 4, corresponding to FIGS. 2A and 2B, respectively;

FIG. 7 is a structural view showing another example of a plasma processing apparatus to which an analytic method of seasoning data, a plasma processing method and a detecting method of completion of seasoning of the present invention are applied;

PREFERRED EMBODIMENTS FOR EMBODYING THE INVENTION

Figure 1B:
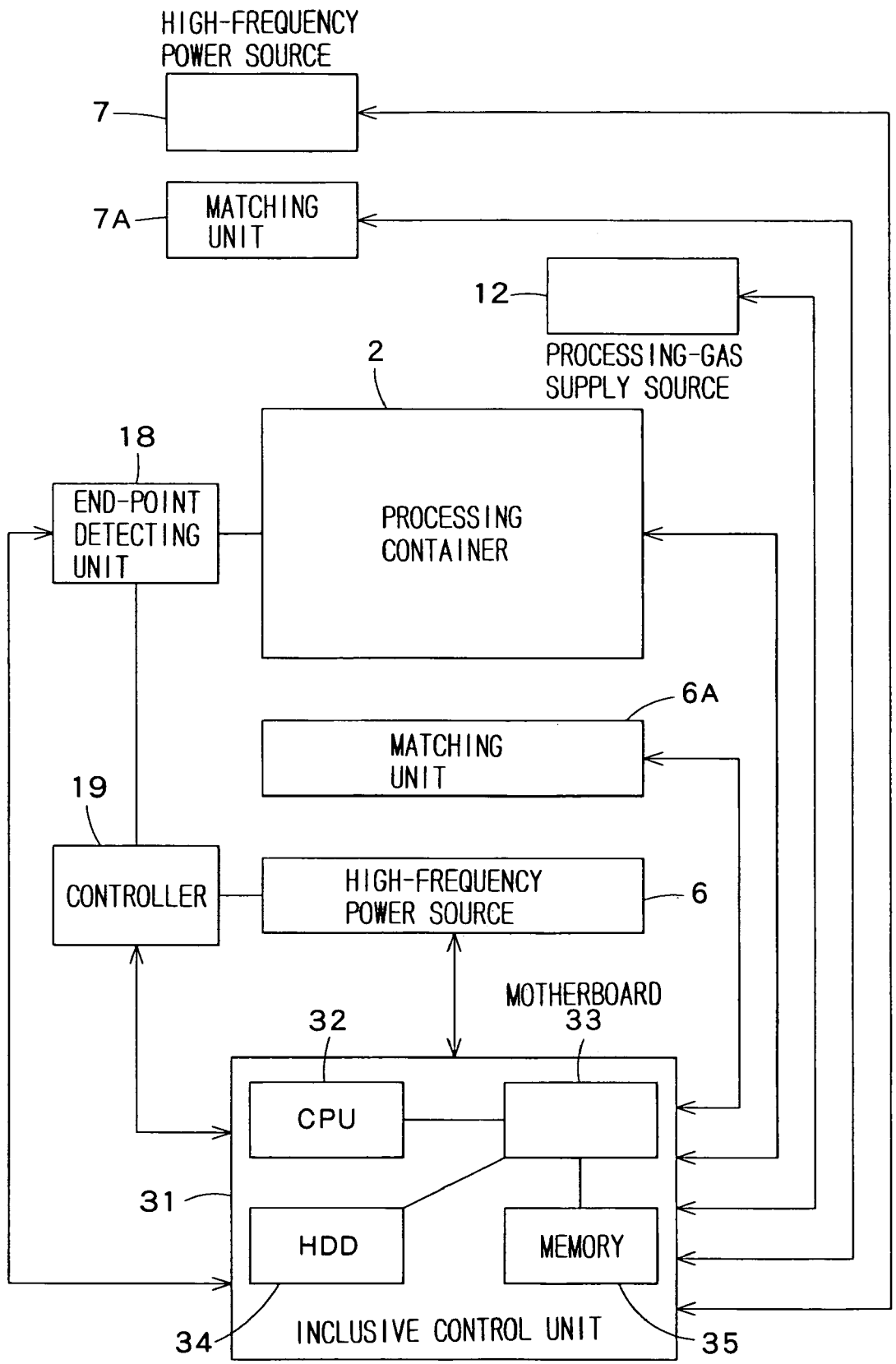
FIG. 1B is a block diagram showing a whole control system of a plasma processing apparatus.

Based on an embodiment shown in FIGS. 1A to 7, the present invention will be described below.

For instance, as shown in FIG. 1A, a plasma apparatus 1 of this embodiment includes a processing container 2 capable of maintaining a desired high vacuum, whose surface is subjected to an alumite processing and which is connected to ground electrically, an lower electrode 3 arranged at the center of a bottom of this processing container 2 to mount an object to be processed (e.g. wafer) W thereon, a support body 4 which supports this lower electrode 3 from its underside and which is arranged on the bottom surface of the processing container 2 through an insulating member 2A, and an upper electrode 5 which is arranged above the lower electrode 3 through a gap and is formed to be hollow. A high-frequency power source 6 of a frequency, for example, 2 MHz is connected to the lower electrode 3 through a matching unit 6A, while a high-frequency power source 7 of a higher frequency than that for the lower electrode 3, e.g. 60 MHz, is connected to the upper electrode 5 through a matching unit 7A. A high-pass filter 8 is connected to the lower electrode 3, while a low-pass filter 9 is connected to the upper electrode 5. An exhaust unit 11 is connected to an exhaust port 2B in the bottom surface of the processing container 2. This exhaust unit 11 evacuates the interior of the processing container 2 to maintain a desired vacuum. Note, in the following description, the lower electrode 3 and the support body 4 may be collectively called "a mount table 10" as occasion demands.

A gas introductory pipe 5A is formed at the center of an upper surface of the upper electrode 5. This gas introductory pipe 5A penetrates the center of an upper surface of the processing container 2 through an insulating member 2C. A processing-gas source 12 is connected to this gas introductory pipe 5A through a gas supply tube 13, so that an etching gas is supplied from the processing-gas supply source 12. That is, the processing-gas supply source 12 includes a $C_5F_8$-gas source 12A, an $O_2$-gas source 12B and an Ar-gas source 12C. The respective gas sources 12A, 12B, 12C are connected to respective branch tubes 13A, 13B, 13C of the gas supply tube 13, respectively. In the branch tubes 13A, 13B, 13C, there are provided, in order from the upstream side toward the downstream sides, flow control units 12D, 12E, 12F and valves 12G, 12H, 12I corresponding to the $C_5F_8$-gas source 12A, the $O_2$-gas source 12B and the Ar-gas source 12C, respectively. Through these flow control units 12D, 12E, 12F and the valves 12G, 12H, 12I, the etching gas to be supplied into the processing container 2 is adjusted with a predetermined flow rate.

A number of holes 5B are formed in the lower surface of the upper electrode 5 equally in dispersion, so that the processing gas is supplied from the respective holes 5B into the processing container 2 equally in dispersion. Therefore, under condition of supplying designated etching gas from the processing-gas source 12 at a designated flow rate while allowing the exhaust unit 11 to evacuate the interior of the processing container 2, respective high-frequency powers are impressed to the lower electrode 3 and the upper electrode 5 to produce a plasma of the etching gas, so that a designated etching is applied on the wafer W on the lower electrode 3. This lower electrode 3 is equipped with a temperature sensor (not shown) that always monitors a temperature of the wafer W on the lower electrode 3.

In the mount table 10, a coolant passage 10A is formed to allow passage of a designated coolant (e.g. fluorinated fluids well known in the art, water, etc.). During flowing of the coolant through the coolant passage 10A, the lower electrode 3 is cooled down. Further, the wafer W is cooled down by the lower electrode 3, accomplishing the wafer W at a desired temperature. Additionally, an electrostatic chuck 14 made from an insulating material is arranged on the lower electrode 3. A high-voltage direct current source 15 is connected to a polar plate 14A in the electrostatic chuck 14. The electrostatic chuck 14 absorbs the wafer W electrostatically due to static electricity produced on the surface of the chuck 14 by a high voltage impressed from the high-voltage direct current source 15 onto the polar plate 14A. A focus ring 16 is arranged on the outer periphery of the lower electrode 3 to surround the electrostatic chuck 14, so that a plasma focuses on the wafer W through the focus ring 16.

A gas flow path 10B is formed in the mount table 10 to supply a heat transfer fluid, such as He-gas, as the backside gas. The gas flow path 10B opens at several positions on the top surface of the mount table 10. These openings coincide with through-holes formed in the electrostatic chuck 14 on the mount table 10. Accordingly, when supplying the backside gas to the gas flow path 10B of the mount table 10, the backside gas flows out of the through-holes of the electrostatic chuck 14 via the gas flow path 10B and successively diffuses into the whole gap between the electrostatic chuck 14 and the wafer W equally, thereby enhancing heat conduction at the gap. Note, in FIG. 1A, reference numeral 17 denotes a gate valve for opening and closing a loading/unloading port for the wafer W, which is formed in the processing container 2.

The plasma processing apparatus 1 is equipped with, for example, an end-point detecting unit 18 to measure an emission spectrum of the plasma in the processing container 2. A measured value by the unit is transmitted to a control unit 19. As a multivariate analysis program, for example, a program for principal components analysis is stored in this control unit 19 in order to carry out the principal components analysis through the program for principal components analysis. When seasoning the processing container 2, the program for principal components is used to analyze data for the seasoning. An emission spectrum data measured by the end-point detecting unit 18 is employed as the data for data-analysis. As the measured data, there are employed one thousand and twenty-four (1024) sorts of wavelengths in the range from 193 nm to 950 nm, for example.

As shown in FIG. 1B, this plasma processing apparatus 1 further includes inclusive control unit 31. This inclusive control unit 31 performs interactive communications through signal cables with all units and devices necessary for predicting a completion of seasoning such as the processing container 2, the end-point detecting unit 18 and the control unit 19. The inclusive control unit 31 has CPU 32, a motherboard 33, a HDD 34 as a storage medium and memory 35, the HDD 34 having a program necessary for performing a prediction of completion of seasoning. Namely, the inclusive control unit 31 perform all instruction and control necessary for predicting the completion of seasoning.

Now, we describe a seasoning-data analytic method of this embodiment, namely, a picking method of measured data used for creating a predictive formula enabling prediction of the completion of seasoning. That is, after cleaning the interior of the processing container 2 or after exchanging consumable goods therein, such as focus ring (not shown), it is carried out to season the processing container 2 for its stabilization, according to the following procedure. First, after starting the plasma processing apparatus 1 on the first day, a dummy wafer (bare silicon) W is loaded into the processing container 2. After that, an etching gas is supplied into the processing container 2 via the gas supply tube 16 to maintain a designated vacuum and then, high-frequency powers (e.g. f60 MHz and 2 MHz) are impressed by the high-frequency power sources 6, 7 for etching. This procession is carried out for plural wafers, for example, one hundred and thirty (130) dummy wafers W, repeatedly. The operation on the first day is completed by processing 130 dummy wafers W.

Subsequently, the etching operation is once stopped and then, it is carried out to leave the processing container 2 as it is for several hours or more while an electric power is being applied to the apparatus, in other words, under condition of allowing it to be restarted immediately. Then, the processing container 2 itself and its internal components, such as the lower electrode 12, which have been heated as a result of the etching process, are cooled down to a preset temperature.

Next, again on the second day, it is carried out to supply a plurality of dummy wafers W, for example, thirty wafers W one by one under the condition of production, thereby repeating the etching cycle. As the interior of the processing container 2 has been cooled down at the beginning of the etching cycle, respective temperatures of the processing container 2 itself, the lower electrode 12 in the processing container 2 and the components, such as focus ring, are gradually elevated in the course of etching from the first dummy wafer W up to the thirtieth dummy wafer. According to the embodiment, it is performed, among thirty wafers, to measure the emission spectrum of each dummy wafer W for eighteen times per about one minute, at the point of each temperature change in the course of etching from the first wafer up to the twentieth wafer and further performed to adopt the luminescence intensity of the above-mentioned two hundreds and ninety-seven (297) sorts of wavelengths as the measured data for principal components analysis. Therefore, the temperature change in the processing container 2 is reflected on these measured data.

In this way, the principal components analysis is carried out by using the above measured data. Provided that, for example, twenty dummy wafers have been measured for m-times (18×20=360 times: this embodiment) and there exist n measured data for every measurement (i.e. luminescence intensity of 297 sorts of wavelengths in this embodiment), a matrix including the measured data will be expressed by a formula 1. In this matrix, each row is composed of the measured data of wavelengths obtained by one measurement, while each column is composed of the measured data changeable on time of each wavelength. After calculating a mean, a dispersion value and a standard deviation on a basis of the respective measured data by the control unit 18, it is carried out to standardize the measured data in the form of the mean and the standard deviation. Then, using a correlation matrix based on these standardized value, it is performed to analyze principal components of the plural measured data, thereby obtaining their characteristic values and characteristic vectors. The characteristic values represent respective magnitudes in dispersion of the respective measured data and are defined as the first principal component, the second principal component . . . , and the n-th. principal component, in order of the magnitudes of the characteristic values. It is further noted that there exist respective characteristic vectors (weights) belonging to the characteristic values, respectively. Normally, as the order of a principal component gets larger, the contribution ratio to the estimation of data is lowered to reduce its utility value.

$$X = \begin{pmatrix} X_{11} & X_{12} & \cdots & X_{1n} \\ X_{21} & X_{22} & \cdots & X_{2n} \\ \vdots & \vdots & \cdots & \vdots \\ X_{m1} & X_{m2} & \cdots & X_{mn} \end{pmatrix} \quad \text{[Formula 1]}$$

According to the embodiment, there are carried out m-times of measurements for twenty (20) dummy wafers wherein n measured data are picked up for each measurement. Thus, the j-th. principal component corresponding to the j-th. characteristic value at the i-th. measurement is expressed by a formula 2. A score of the j-th. principal component about the i-th. measurement is obtained by substituting the detailed measured data $(X_{i1}\ X_{i2} \ldots X_{in})$ at the i-th. measurement into the j-th. principal component $t_{ij}$. Therefore, the score $t_j$ of the j-th. principal component is defined by a formula 3, while the characteristic vector $P_j$ of the j-th. principal component is defined by a formula 4. Then, when using the matrix X and the characteristic vector $P_j$, the score $t_j$ of the j-th. principal component is expressed by a formula 5. The matrix X is expressed by a formula 6 while using the scores of the principal components and their respective characteristic vectors.

$$t_{ij} = X_{i1}P_{j1} + X_{i2}P_{j2} + \cdots X_{in}P_{jn} \quad \text{[Formula 2]}$$

$$t_j = \begin{pmatrix} t_{1j} \\ t_{2j} \\ \vdots \\ t_{mj} \end{pmatrix} \quad \text{[Formula 3]}$$

$$p_j = \begin{pmatrix} p_{j1} \\ p_{j2} \\ \vdots \\ p_{jn} \end{pmatrix} \quad \text{[Formula 4]}$$

$$t_j = XP_j \quad \text{[Formula 5]}$$

$$x = t_1 P_1^T + t_2 P_2^T + \cdots + t_n P_n^T \quad \text{[Formula 6]}$$

Note; $P_n^T$ is a transposed matrix of $P_n$.

Accordingly, although the principal components analysis contains large variety of measured data, if only gathering and successively examining small quantity of statistical data, for example, both of the first principal component and the second principal component, alternatively, those plus the third principal component at most, then it becomes possible to grasp the situation of seasoning and also judge the completion of seasoning. For instance, generally, if an accumulated contribution ratio of the characteristic values of the first and second principal components exceeds 90%, then such an estimation based on the first and second principal components gets high reliability. As mentioned above, the first principal component represents a direction that the measured data diffuses in the largest way, being better suited to grasp the change over time of the seasoning of the processing container 2 and also judge the completion of seasoning. Variations, which are ungraspable by the first and second principal components perfectly, are graspable by the scores of residual errors. This embodiment is directed to the first principal component.

Figure 2A:
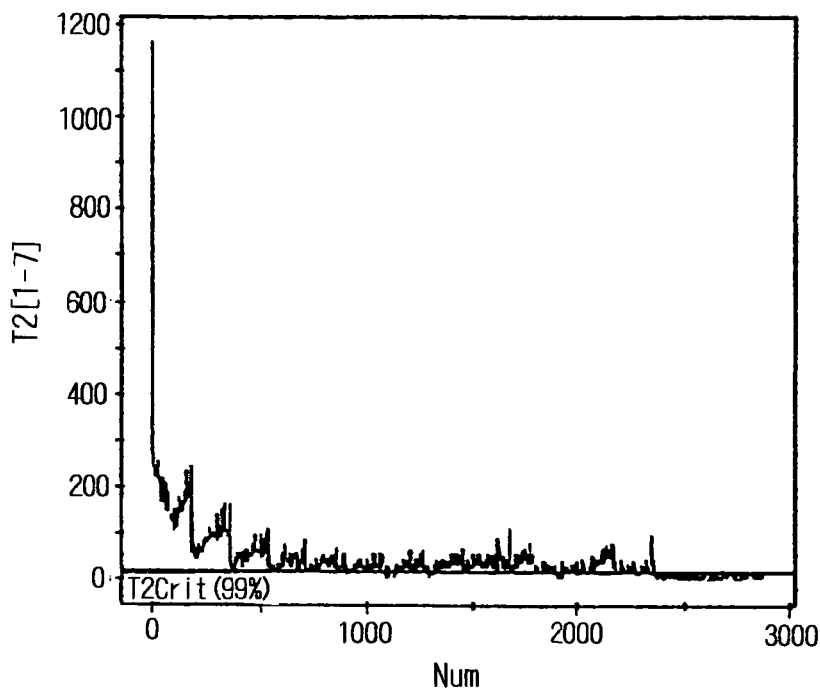
Figure 2B:
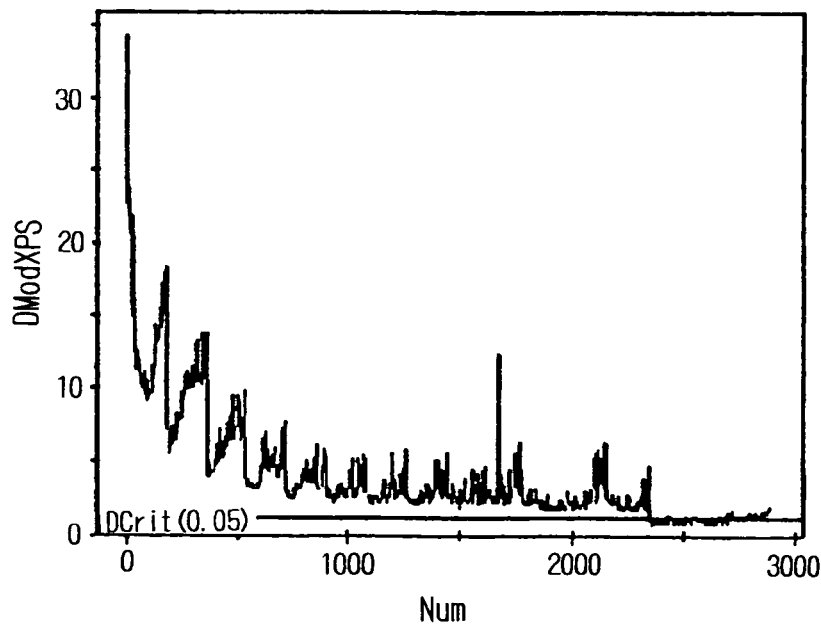

Therefore, in the embodiment, it is carried out to etch the dummy wafers W under the following conditions. Then, due to the principal component analysis of a measured data at this etching, characteristic values are calculated by use of a correlation matrix of the measured data. In these values, the largest characteristic value provides a dispersion of the scores of the first principal component. Then, the characteristic vector can be obtained by the characteristic values and the correlation matrix. Then, by calculating the scores of the principal components of the respective measured data and further plotting the square sums (HOTELLINGS TSQUARE) of the scores of the respective principal components, we now provide a graphs of FIG. 2A. As obvious from this graph, there is recognized a great peak on the first day only and there is no peak in the measured data on the second day, allowing the completion of seasoning to be judged definitely. Additionally, FIG. 2B is obtained by plotting the square sums of the residual errors of the respective measured data. Also in this diagram, since the measured data on the first day only contains a great peak, it is possible to judge the completion of seasoning certainly. It is noted that the horizontal axis of each graph denotes the number of measurements. In common with the graphs, the horizontal axis has 2880 (=18×160) scale marks since eighteen measurements have been carried out per one dummy wafer W in the embodiment and additionally, one hundred and sixty (160) dummy wafers W have been processed for two days.

[Processing Conditions]
Processing Apparatus:

Capacitive coupled/parallel plate plasma apparatus

Dummy Wafer (bare silicon): 300 mm
Frequency and Power of Lower Electrode: 2 MHz, 3800 W
Frequency and Power of Upper Electrode: 60 MHz, 3300 W
Processing Pressure: 25 mTorr
Etching Gas: $C_5F_8$=29 sccm
Ar=750 sccm, $O_2$=47 sccm
Backside Gas: He=15 Torr (pole center)
40 Torr (pole edge)
Processing Temperature: Upper Electrode=60° C., Sidewall=60° C., Lower Electrode=20° C.

As mentioned above, according to this embodiment, in detail, in the method of creating a predictive formula for predicting the completion of seasoning, after the plasma processing apparatus 1 is once stopped in the middle of the production process while using the dummy wafers W, the processing container 2 is left as it is for several hours to cool down the processing container 2 itself and the internal components, such as the lower electrode 12 and thereafter, it is carried out to pick up a measured data for judging the completion of seasoning while processing twenty dummy wafers W in the production process again. Thus, it is possible to obtain the measured data where temperature changes in the processing container 2 itself and also the components, such as the lower electrode 3, are reflected and also possible to exclude a peak based on the temperature changes by the analytic result. Additionally, by adopting this analytic result at the seasoning, it is possible to certainly detect and judge the completion of seasoning. Thus, the plasma processing based on such an absolute detection of the completion of seasoning allows a stable etching to be applied on wafers.

FIGS. 3A and 3B are diagrams showing the data analytic method in accordance with another embodiment of the present invention. According to this embodiment, different from the above-mentioned embodiment, it is carried out to calculate a mean of eighteen measured data (297 sorts of wavelengths) obtained for each dummy wafer W and thereafter, the principal component analysis using these mean values is carried out to calculate the characteristic values and the characteristic vectors. Then, by plotting the square sums of the scores of principal components and the square sums of residual errors of the respective dummy wafers W, graphs of FIGS. 3A and 3B are obtained respectively. As obvious from FIGS. 3A and 3B, these graphs enable a judgment of the completion of seasoning in the same manner as FIGS. 2A and 2B. Note, numeral values of the horizontal axis denote the number of dummy wafers.

Figure 4:
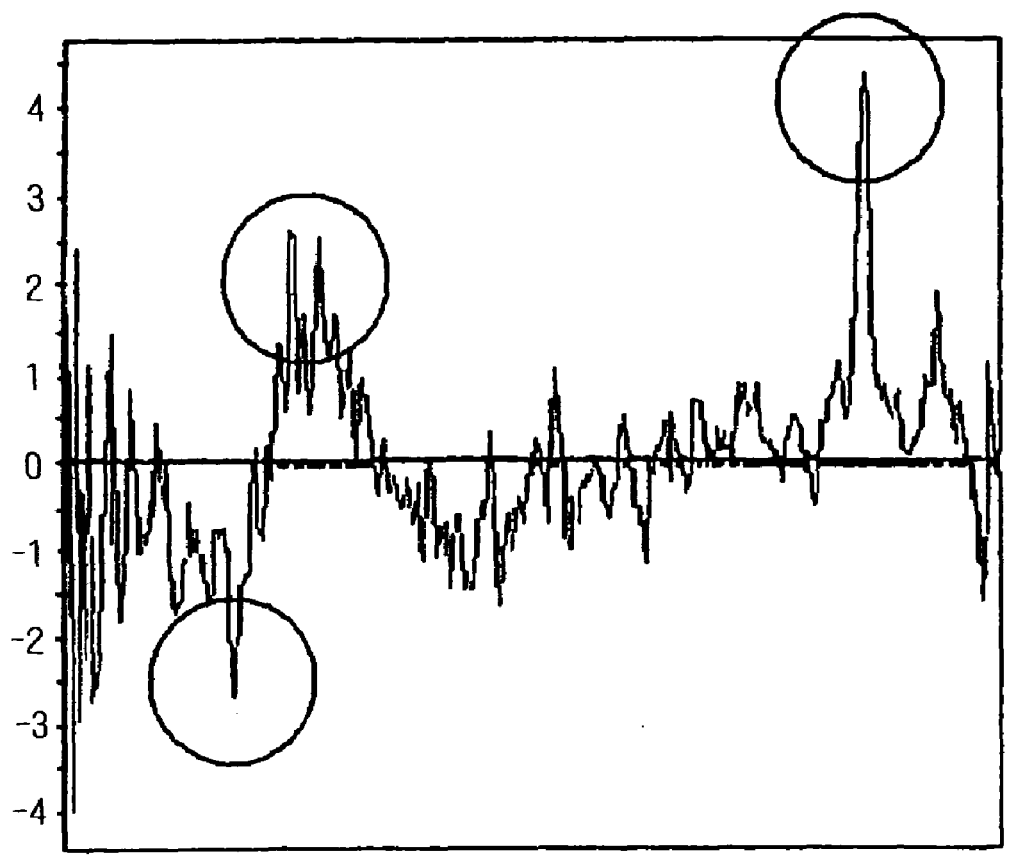
FIG. 4 is a graph showing the contribution ratio of an emission spectrum used in another embodiment of the present invention to the residual errors of the measured data.

Further, FIGS. 4, 5A and 5B are diagrams showing the data analytic method in accordance with a further embodiment of the present invention. According to this embodiment, as shown in FIG. 4, it is carried out to select plural sorts, e.g. ten sorts of wavelengths all having high contribution ratios to the residual errors of the measured data (e.g. wavelengths surrounded by circles of FIG. 4) and continuously calculate a mean of ten sorts of wavelengths for each dummy wafer W and thereafter, the principal component analysis using these mean values is carried out to calculate the characteristic values and the characteristic vectors. Then, by plotting the scores of the first principal components and the scores of the residual errors of the respective dummy wafers W, graphs of FIGS. 5A and 5B are obtained respectively. As obvious from FIGS. 5A and 5B, their jagged lines are weakened into smooth curves in comparison with those of the embodiment of FIGS. 2A and 2B, allowing the completion of seasoning to be judged easier.

Figure 6A:
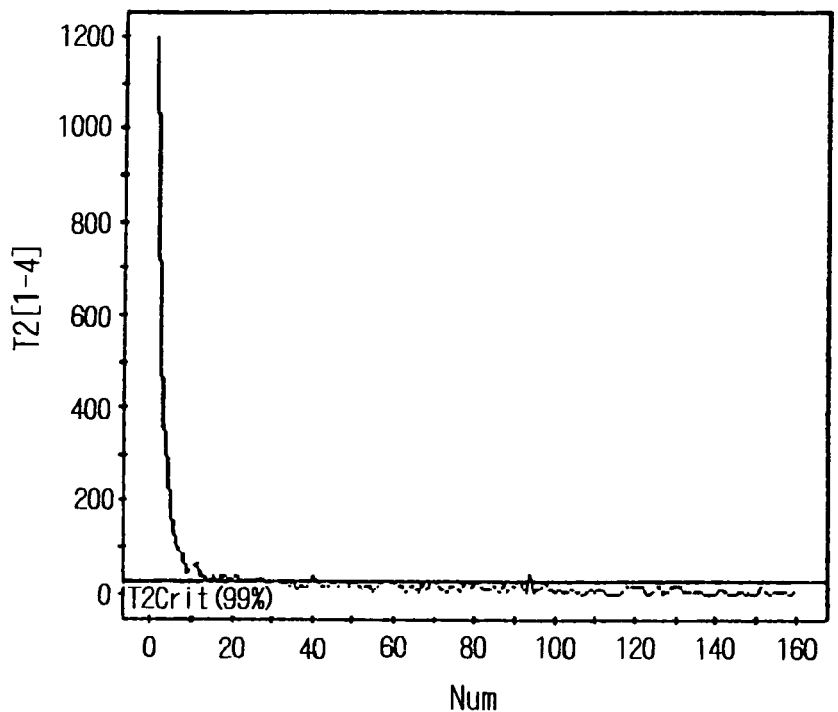
FIGS. 6A and 6B are diagrams showing the analytic result obtained by using the wavelengths shown in FIG. 4, corresponding to FIGS. 2A and 2B, respectively.
Figure 6B:
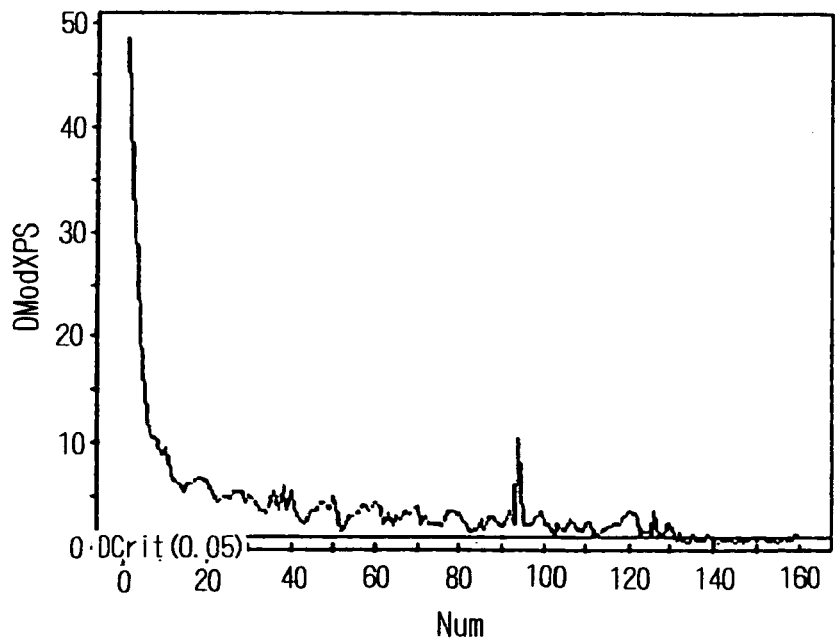
Figure 8A:
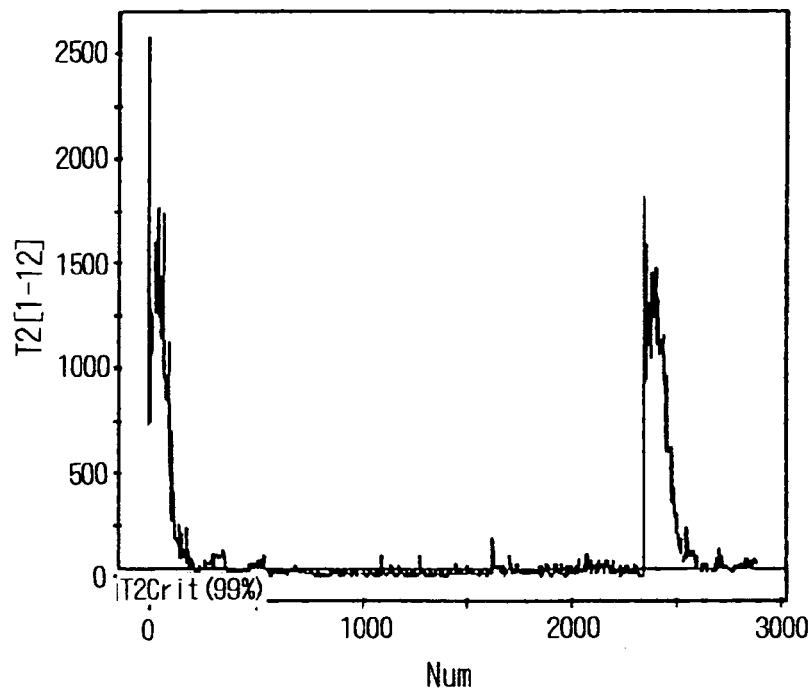
FIGS. 8A and 8B are diagrams showing analytic results obtained by the conventional analytic method in case of using the $51^{st}$. to $60^{th}$. dummy wafers on the first day of seasoning, corresponding to FIGS. 2A and 2B respectively.
Figure 8B:
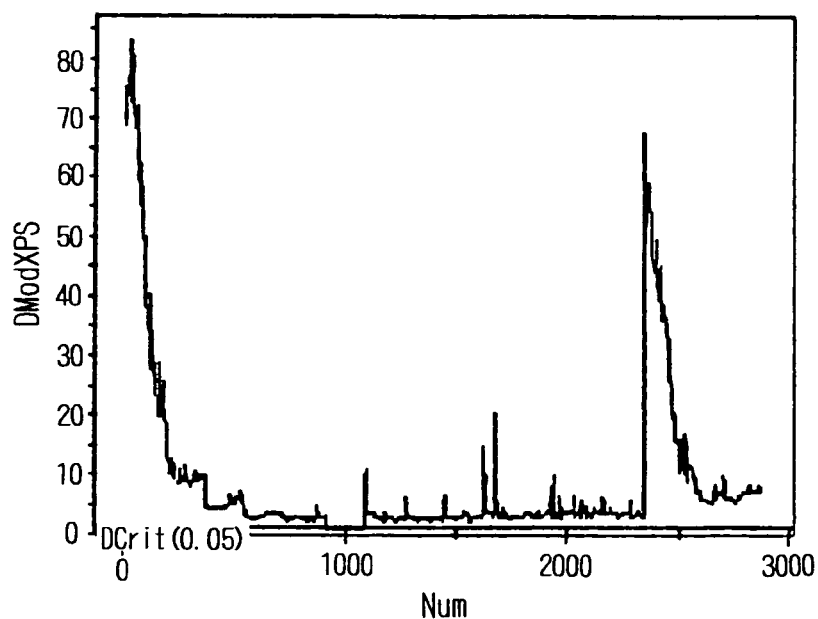
Figure 9A:
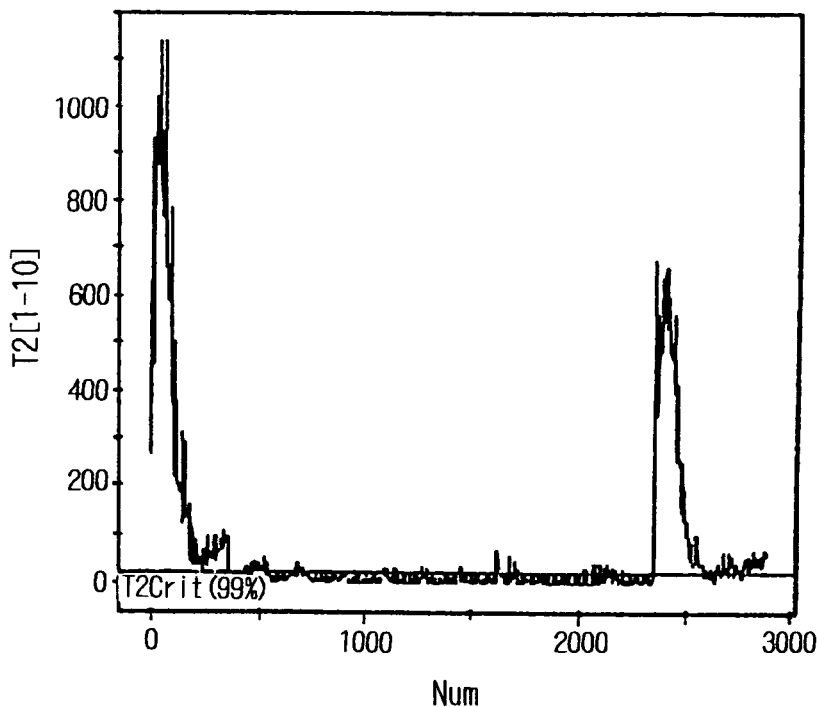
FIGS. 9A and 9B are diagrams showing the other analytic result obtained by the conventional analytic method in case of using the $121^{st}$. to $130^{th}$. dummy wafers on the first day of seasoning, corresponding to FIGS. 2A and 2B respectively.
Figure 9B:
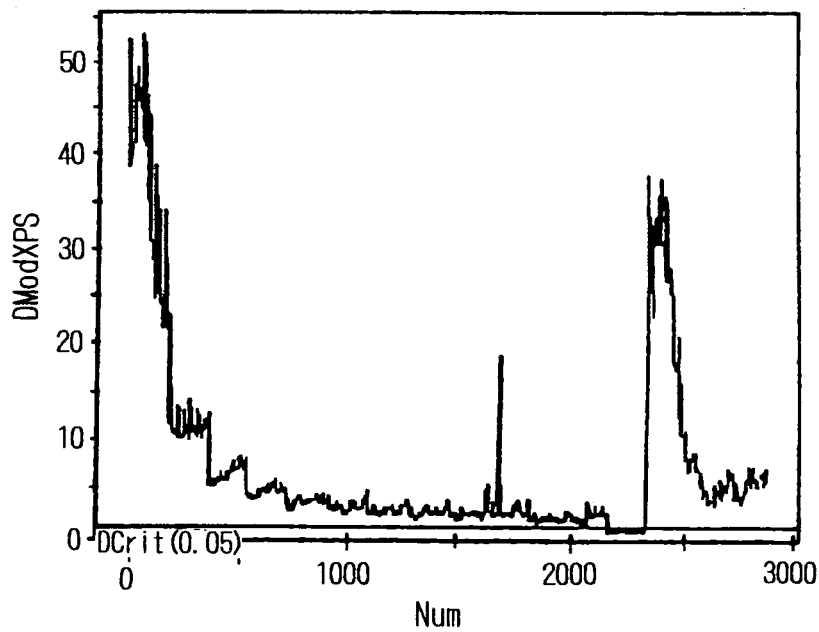

Further, FIGS. 6A and 6B are diagrams showing the data analytic method in accordance with a still further embodiment of the present invention. According to this embodiment, as similar to the embodiment of FIGS. 5A and 5B, it is carried out to select ten sorts of wavelengths all having high contribution ratios to the residual errors of the measured data. While the embodiment of FIGS. 5A and 5B adopts the time-mean values of the measured data of the respective wavelengths for every dummy wafers W, this embodiment adopts the measured data itself, which is similar to the embodiment of FIGS. 2A and 2B. In the embodiment of FIGS. 2A and 2B, however, each row of the matrix is formed by the measured data of wavelengths obtained by one measurement and each column is formed by the measured data changeable on each wavelength time. To the contrary, respective rows and columns are transposed with respect to the respective dummy wafers W and the respective wavelengths. Since there are sixteen measurements per ten wavelengths, one row is formed by one hundred and sixty (160=10×16) constituents. Since one row includes twenty wafers in practice set, the practice set of principal component analysis of twenty constituents forms a matrix of twenty (20) rows and one hundred and sixty (160) columns. Then, by executing the principal component analysis based on the above matrix and further plotting the square sums of the scores of principal components and the square sums of residual errors, graphs of FIGS. 6A and 6B are obtained respectively. As obvious from FIGS. 6A and 6B, their jagged lines are weakened into smoother curves in comparison with the graphs of FIGS. 5A and 5, allowing the completion of seasoning to be judged easier.

Additionally, the present invention is applicable to also a plasma processing apparatus 20 of FIG. 7 in the same manner as the above-mentioned plasma processing apparatus 1 and therefore, the similar operation and effect could be expected. This plasma processing apparatus 20 includes, as shown in FIG. 7, a processing container 21 made from conductive material, such as aluminum, a lower electrode 22 arranged on the bottom surface of the processing container 21 to serve as a mount table for mounting a wafer W thereon, a hollow upper electrode 23 connected to ground and also arranged above the lower electrode at a predetermined interval to serve as a supplier of etching gas, and a magnetic-field generating means 24 for applying a rotating magnetic field. Since the rotating magnetic field B by the magnetic-field generating means 24 acts on an electric field produced between the upper and lower electrodes of the processing container 21 under the control of a control unit 25, the apparatus performs a uniform plasma treatment against the wafer W with a high density plasma.

A gas supply tube 26 in communication with the upper electrode 23 is connected to the top surface of the processing container 21 to supply an etching gas into the processing container 21 through the gas supply tube 26 and the upper electrode 23. A gas exhaust tube 27 in association with a not-shown vacuum pumping unit is connected to the side surface of the processing container 21, so that the interior of the processing container 21 is depressurized through the vacuum pumping unit and the gas exhaust tube 27 to maintain a designated vacuum. A high-frequency power source 28 is connected to the lower electrode 22. In operation, the high-frequency power source 28 impresses a high-frequency power to the lower electrode 22. 8 to produce a plasma of etching gas between the electrodes 22, 23 thereby applying e.g. a designated etching treatment on the semiconductor wafer W on the lower electrode 22.

For example, the plasma processing apparatus 20 is equipped with an end-point detecting unit 29 that measures an emission spectrum of the plasma in the processing container 21. This measured value is inputted to the control unit 25. A multivariate analysis program, for example, a program for principal component analysis is stored in the control unit 25 thereby executing the principal component analysis. This program for principal component analysis is used in order to analyze data for seasoning when seasoning the processing container 21. Employed as the data for data-analysis is a measured data of an emission spectrum of the end-point detecting unit 29. For example, one thousand and twenty-four (1024) sorts of wavelengths within the range from 191 nm to 950 nm are used as the measured data.

Note, although the above-mentioned embodiments have been illustrated by citing the example of principal component analysis as the data-analytic method of judging the completion of seasoning, the other multivariate analysis may be adopted in the modification. Further, although the above-mentioned embodiments have been illustrated by citing the example of using the emission spectrum of a plasma, there may be employed the other measured data, that is, measured data that is easy to be influenced by temperature change in the processing container, for example, high-frequency voltage detected by an electricity measuring unit (VI probe) in a plasma processing apparatus, high-frequency current, phase difference between high-frequency voltage and high-frequency current, etc. Again, although the above-mentioned embodiments have been illustrated by citing the example of an etching apparatus, the present invention is applicable to the other plasma processing apparatus.

According to the present invention as claimed in Claims 1 to 16, it is possible to provide a plasma processing method, a detecting method of the completion of seasoning, a plasma processing apparatus and a storage medium all that enable the completion of seasoning to be judged definitely.

The invention claimed is:

1. A plasma processing method for detecting a completion of seasoning in case of performing a seasoning by loading test objects to be processed into a processing container of a processing apparatus, the method comprising the steps of:
   creating a predictive formula for predicting the completion of seasoning, the predictive formula being created by applying a multivariate analysis on a plurality of measured data obtained from a plurality of test objects loaded into the processing container, the plurality of test objects being loaded and plasma processed after a cooling step of an interior of the processing container that is conducted after another plurality of test objects is loaded and plasma processed; and
   detecting the completion of seasoning in performing the seasoning, on a basis of the predictive formula.

2. The plasma processing method as claimed in claim 1, wherein the multivariate analysis is carried out by employing a principal component analysis.

3. The plasma processing method as claimed in claim 1, wherein the multivariate analysis is carried out by employing an emission spectrum of a plasma as the measured data.

4. The plasma processing method as claimed in claim 3, wherein among wavelengths of the emission spectrum, a wavelength having a high contribution ratio to a residual error is employed.

5. The plasma processing method as claimed in claim 1, wherein the multivariate analysis is carried out by employing a high-frequency voltage obtained by an electricity measuring unit, as the measured data.

6. The plasma processing method as claimed in claim 1, wherein the multivariate analysis is carried out by employing a high-frequency current obtained by an electricity measuring unit, as the measured data.

7. The plasma processing method as claimed in claim 1, wherein the multivariate analysis is carried out by employing a difference in phase between a high-frequency voltage and a high-frequency current both obtained by an electricity measuring unit, as the measured data.

8. A seasoning-completion detecting method for detecting a completion of seasoning in case of performing a seasoning by loading test objects to be processed into a processing container of a processing apparatus, the method comprising the steps of:
   creating a predictive formula for predicting the completion of seasoning, the predictive formula being created by applying a multivariate analysis on a plurality of measured data obtained from a plurality of test objects loaded into the processing container, the plurality of test objects being loaded and plasma processed after a cooling step of an interior of the processing container that is conducted after another plurality of test objects is loaded and plasma processed; and
   detecting the completion of seasoning in performing the seasoning, on a basis of the predictive formula.

9. A plasma processing apparatus comprising:
a processing container for accommodating an object to be processed;
a detecting unit for measuring an emission spectrum of a plasma in the processing container; and
a control unit which is connected to the detecting unit and constructed so as to input measured data from the detecting unit, the control unit being adapted so as to create a predictive formula for predicting a completion of seasoning and further detect the completion of seasoning in performing the seasoning on a basis of the predictive formula, wherein the predictive formula is created by applying a multivariate analysis using a multivariate analysis program on a plurality of measured data measured by the detecting unit in the process of: loading plural test objects to be processed into the processing container, the plurality of measured data being obtained from a plurality of test objects, the plurality of test objects being loaded and plasma processed after a cooling step of an interior of the processing container that is conducted after another plurality of test objects is loaded and plasma processed.

10. A plasma processing apparatus comprising:
a processing container for accommodating an object to be processed;
an electricity measuring unit arranged in the processing container; and
a control unit which is connected to the electricity measuring unit and constructed so as to input measured data from the electricity measuring unit, the control unit being adapted so as to create a predictive formula for predicting a completion of seasoning and further detect the completion of seasoning in performing the seasoning on a basis of the predictive formula, wherein the predictive formula is created by applying a multivariate analysis using a multivariate analysis program on a plurality of measured data measured by the electricity measuring unit in the process of: loading plural test objects into the processing container, the plurality of measured data being obtained from a plurality of test objects, the plurality of test objects being loaded and plasma processed after a cooling step of an interior of the processing container that is conducted after another plurality of the test objects is loaded and plasma processed.

11. A storage medium having a program for detecting a completion of seasoning in case of performing a seasoning by loading test objects to be processed into a processing container of a processing apparatus, the program comprising the steps of:
creating a predictive formula for predicting the completion of seasoning, the predictive formula being created by applying a multivariate analysis on a plurality of measured data obtained from a plurality of test objects loaded into the processing container, the plurality of test objects being loaded and plasma processed after a cooling step of an interior of the processing container that is conducted after another plurality of test objects is loaded and plasma processed; and
detecting the completion of seasoning on the basis of the predictive formula.

* * * * *

UNITED STATES PATENT AND TRADEMARK OFFICE
CERTIFICATE OF CORRECTION

| | | |
|---|---|---|
| PATENT NO. | : 7,313,451 B2 | Page 1 of 1 |
| APPLICATION NO. | : 10/937905 | |
| DATED | : December 25, 2007 | |
| INVENTOR(S) | : Naoki Takayama et al. | |

It is certified that error appears in the above-identified patent and that said Letters Patent is hereby corrected as shown below:

Title page, left column, please insert the following

--[30], Foreign Application Priority Data

March 12, 2002   (JP) .........................2002-066369

Signed and Sealed this

Twenty-ninth Day of July, 2008

JON W. DUDAS
*Director of the United States Patent and Trademark Office*